(12) United States Patent
Verdun

(10) Patent No.: US 8,175,825 B2
(45) Date of Patent: May 8, 2012

(54) METHODS AND SYSTEMS FOR AUTO-CALIBRATED POWER METERING IN PORTABLE INFORMATION HANDLING SYSTEMS

(75) Inventor: Gary J. Verdun, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 743 days.

(21) Appl. No.: 12/283,151

(22) Filed: Sep. 10, 2008

(65) Prior Publication Data

US 2010/0063755 A1 Mar. 11, 2010

(51) Int. Cl.
G01R 21/06 (2006.01)

(52) U.S. Cl. .......... 702/62; 702/61; 702/85; 340/870.04

(58) Field of Classification Search ............. 702/62
See application file for complete search history.

(56) References Cited

U.S. PATENT DOCUMENTS

| | | | | |
|---|---|---|---|---|
| 4,951,171 | A | 8/1990 | Tran et al. | 361/90 |
| 5,315,228 | A | 5/1994 | Hess et al. | 320/31 |
| 6,367,023 | B2 | 4/2002 | Kling et al. | 713/340 |
| 6,463,545 | B1 * | 10/2002 | Fisher et al. | 713/340 |
| 6,735,535 | B1 | 5/2004 | Kagan et al. | 702/61 |
| 6,813,897 | B1 * | 11/2004 | Bash et al. | 62/175 |
| 7,178,043 | B2 | 2/2007 | Nakazato | 713/300 |
| 7,853,818 | B2 * | 12/2010 | Nguyen | 713/340 |
| 2002/0180420 | A1 * | 12/2002 | Lavoie et al. | 324/142 |
| 2006/0192530 | A1 * | 8/2006 | Nguyen | 320/128 |
| 2006/0282687 | A1 | 12/2006 | Bahali et al. | 713/300 |
| 2008/0157593 | A1 * | 7/2008 | Bax et al. | 307/10.1 |

* cited by examiner

*Primary Examiner* — Jonathan C Teixeira Moffat
(74) *Attorney, Agent, or Firm* — O'Keefe, Egan, Peterman & Enders, LLP

(57) ABSTRACT

Accurate power usage for a portable information handling system is provided using input power measurement circuitry. A calibration step is performed when the portable information handling system is powered down and charging. The calibration step includes obtaining a battery charge measurement from a battery, and then using this measurement to calibrate an input power measurement made with respect to power being provided by the AC/DC adapter. Known losses from other sources within the system can also be considered in the auto-calibration of the input power measurement. Subsequently, when the portable information handling system is powered on and operating on power provided by the AC/DC adapter, power usage can be determined and reported using the auto-calibrated input power measurement as an indication of the power usage of the portable information handling system.

10 Claims, 4 Drawing Sheets

METHODS AND SYSTEMS FOR AUTO-CALIBRATED POWER METERING IN PORTABLE INFORMATION HANDLING SYSTEMS

TECHNICAL FIELD

The techniques described herein relate to methods and systems for determining power usage in portable information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many portable information handling systems use battery chargers to control the charging of batteries associated with the portable information handling system. Some portable information handling systems have circuitry within the battery charger that is used to limit input power depending on the type of alternating current (AC) adapter used with the system. This input power measurement provides a course measurement of input power for the sole purpose of limiting input power. Input power limits are required in certain geographic regions, and input power control is provided to meet these requirements.

Many users of portable information handling systems desire the ability to measure power usage by the portable information handling systems. While accurate power usage measurement exists for more expensive server systems and other higher-end systems that are designed to run primarily on an AC power supply, power usage measurements for portable systems are not accurate and are often not even available. As such, users and enterprise owners of portable information handling systems have little if any visibility in to the power utilized by these portable information handling systems.

SUMMARY

Systems and methods are disclosed herein for auto-calibrating power metering within portable information handling system so that accurate power usage can be determined and reported for the portable information handling systems. A portable information handling system is provided with a battery, a charger and an AC/DC adapter. When the portable information handling system is powered down and charging, a calibration step is performed. The calibration step includes using a battery charge measurement from the battery to calibrate an input power measurement related to the AC/DC adapter. In addition, power losses from known sources within the system can also be considered in this calibration step. When the portable information handling system is subsequently powered on and operating on power provided by the AC/DC adapter, power usage can be obtained and reported using the auto-calibrated input power measurement. As described below, other features and variations can be implemented, if desired, and related systems and method can be utilized, as well.

DESCRIPTION OF THE DRAWINGS

It is noted that the appended drawings illustrate only exemplary embodiments of the techniques described herein and are, therefore, not to be considered limiting of its scope, for the techniques may admit to other equally effective embodiments.

DETAILED DESCRIPTION

Figure 1A:
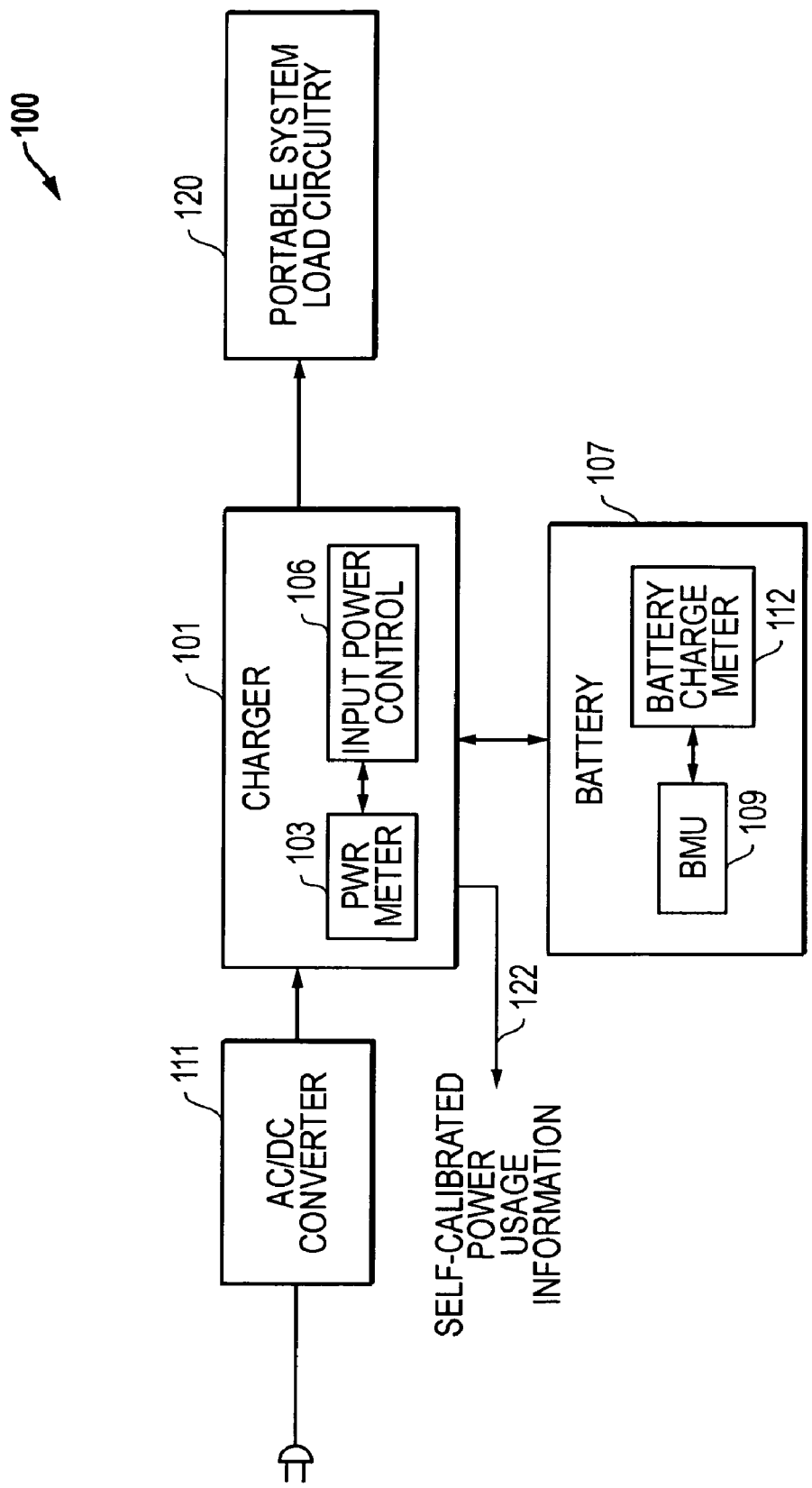
FIG. 1A is a block diagram of a portable information handling system having an auto-calibrated power usage meter.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a server computer system, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of non-volatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

The techniques described herein provide methods and systems for auto-calibrating and determining power usage information for portable information handling systems. Input power meter circuitry associated with an AC/DC adapter is calibrated and used to measure and report power usage information. As described below, a calibration step is performed when the portable information handling system is powered down and the battery is charging. The calibration step includes obtaining a battery charge measurement from a battery and using this battery charge measurement to calibrate an input power measurement associated with the AC/DC adapter. For example, by comparing the input power measurement (relatively imprecise) and battery charge measurement (relatively precise), a calibration factor can be determined for the input power measurement. Power losses from known sources within the system, such as losses from the charger and from the AC/DC adapter, can also be considered in conducting this calibration. When the portable information handling system is then powered on and operating using the AC/DC adapter, power usage information can be determined and reported by using measurements from the auto-calibrated input power meter as an indication of power usage by the portable information handling system. Various features and embodiments associated with the described methods and systems can be implemented, as desired.

Current notebook computers, for example, have circuitry in the battery charger that is used to limit input DC power depending on the AC/DC adapter being used by the notebook computer. This circuitry uses a relatively imprecise and course measurement of the DC input power to perform this input power limitation function. The systems and methods described herein allow an embedded controller or other control circuitry to use this coarse input power reading to make more precise measurements of input system power. In particular, the imprecise DC input power measurement can be auto-calibrated to make it a more precise power measurement for purposes of reporting input power usage. The auto-calibration can be performed by comparing the imprecise input DC power measurement from the charger to the power entering the battery during periods when the system is "off" and the battery is charging. The system "off" battery charge condition is a relatively constant load, and the accuracy of the battery charge current metering is very accurate in the high charge current region thereby providing a relatively high accuracy reference to compare the charger based readings against for calibration purposes. The rest of the system power consumption at this time is typically small and can be easily estimated or ignored. When the system is subsequently operating, the AC power usage can then be determined and reported by obtaining the auto-calibrated input power measurement and then by applying efficiency curves for the AC/DC adapter being used by the system.

The methods and systems for auto-calibrating an input power meter for portable information handling systems will now be further described with respect to the example embodiments set forth in FIGS. 1A, 1B, 2 and 3.

FIG. 1A is a block diagram of a portable information handling system 100 having a battery 107 and a charger 101 for determining power usage of the portable information handling system 100. The portable information handling system has an AC/DC adapter or converter 111 that can be plugged into an AC power source to provide DC power to the portable system load circuitry 120. The charger 101 is coupled to the AC/DC converter 111 and includes input power control circuitry 106, as described above, that operates to limit the overall DC input power for the system. The charger 101 also includes power meter control circuitry 103, as described herein, that provides for auto-calibration of an input power meter associated with the input power control circuitry 106. The battery 107 is coupled to the charger 101 and includes a battery management unit (BMU) 109 and a batter charge meter 112.

The portable system load circuitry 120 receives power from the AC/DC converter 111 or the battery 107 depending upon how charge and discharge paths are controlled by the charger 101. If the AC/DC converter 111 is connected to an AC power source, the charger 101 will typically set connection paths to provide power to the portable load circuitry 120 from the AC/DC converter 111. At the same time, the charger 101 will provide a connection path to allow the battery cells within the battery 107 to be charged by the AC power source through the AC/DC converter 111. If the AC/DC converter 111 is not connected to an AC power source, the charger 101 will set connection paths to provide power to the portable system load circuitry 120 from the battery 107. At this time, the battery cells within the battery 107 will be discharging.

The operation of the components within FIG. 1A is generally known except for the operation of the power meter control circuitry 103 as described herein. While prior portable systems have typically been unable to report accurate power usage information, the power meter control circuitry 103 as described herein provides efficient and effective power usage information. In particular, when the system is powered down and the battery is charging, the power meter control circuitry 103 calibrates imprecise input power measurement circuitry within a battery charger using information from a precise battery charge meter within a battery. Once calibrated, the input power measurement circuitry becomes significantly more precise. As such, when the system is subsequently powered up and operating, the power meter control circuitry 103 can now use the auto-calibrated input power measurement circuitry to provide a relatively accurate power usage measurement for the information handling system 100. The power meter control circuitry 103, therefore, allows for auto-calibrated power usage information 122 to be reported for the portable information handling system 100. It is noted that although the power meter control circuitry 103 and the input power control circuitry 106 are depicted as being within the charger 101, either one or both of elements could be located outside the charger 101, if desired, while still taking advantage of auto-calibrated input power measurements using battery charge measurements from the battery 107. It is further noted that the power meter control circuitry 103 can be implemented as hardware, software, or a combination of hardware and software. For example, power meter control circuitry 103 can be implemented as software running on embedded controller 102. As such, this software can be operated to make decisions concerning whether to run a calibration sequence, to compare values, to calculate calibration factors and to apply these factors to later power measurements.

Figure 1B:
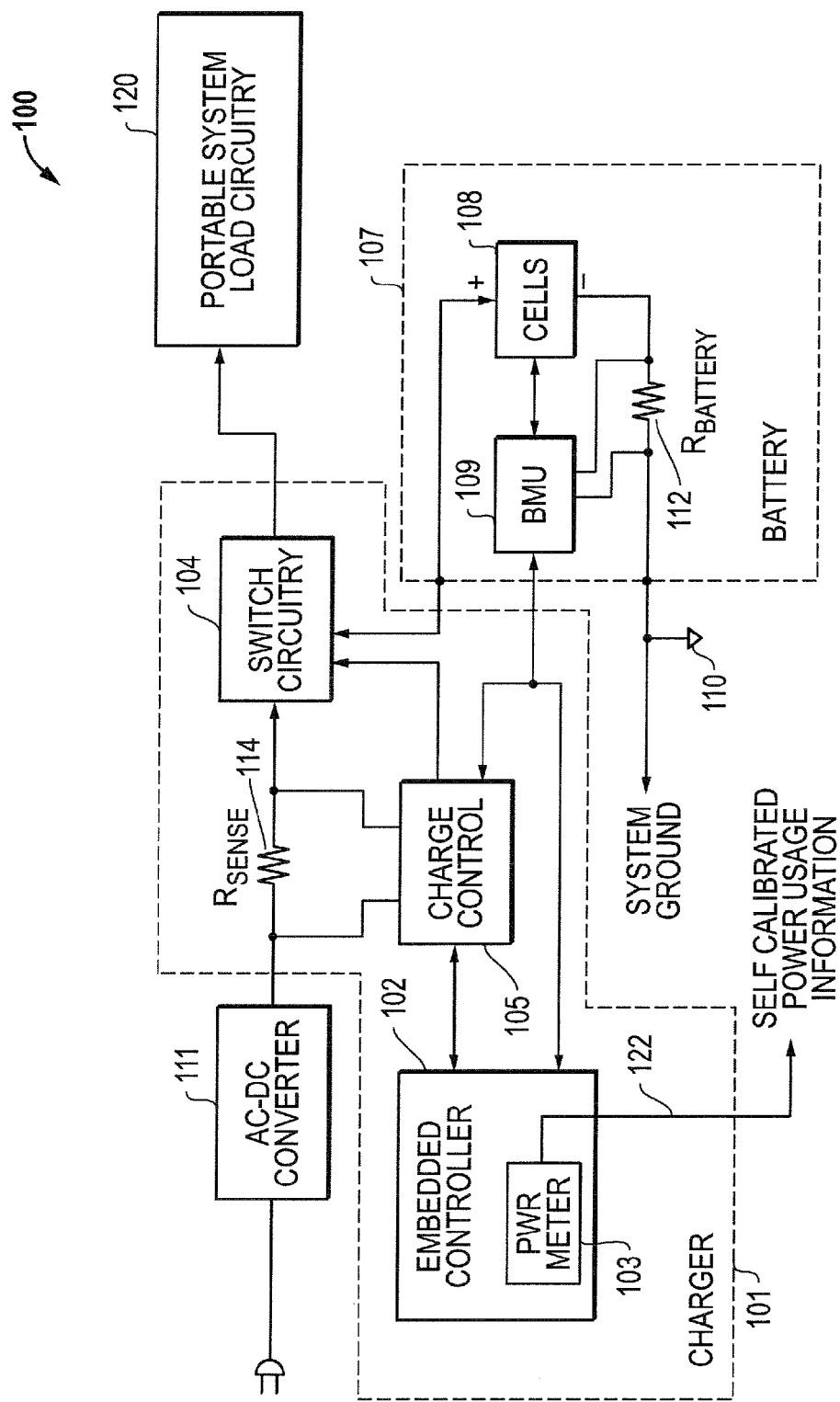
FIG. 1B is a more detailed block diagram for the system of FIG. 1A.

FIG. 1B is a more detailed block diagram for the system of FIG. 1A. In particular, the charger 101 and the battery 107 are shown in more detail. As depicted, the charger 101 includes an embedded controller 102, charge control circuitry 105, switch circuitry 104 and an input power sensing resistor ($R_{SENSE}$) 114. The embedded controller 102 includes the power meter control circuitry 103 and can be configured to be powered through the AC/DC converter 111 when the portable system is powered down. The battery 107 includes battery cells 108, the BMU 109 and a battery charge sense resistor ($R_{BATTERY}$) 112. System ground 110 is coupled to the negative terminal of the battery cells 108, and system power is coupled to the positive terminal of the battery cells 108. The switch circuitry 104 is controlled by the charge control circuitry 105 so that the portable system load circuitry 120 is powered by the battery when the AC/DC converter 111 is not connected to an AC power source and is powered by the AC/DC converter 111 when it is connected to an AC power source. The charge control circuitry 105 also provides for a charging current to the battery cells 108 from the AC/DC converter 111 when the AC/DC converter 111 is connected to an AC power source.

The input power sensing resistor ($R_{SENSE}$) 114 has been traditionally used to measure DC input power being provided by the AC/DC adapter 111 and passing through the charger 100. The charge control circuitry 105 then monitors and controls this DC input power so that it does not rise above a set threshold level. The input power sensing resistor ($R_{SENSE}$) 114 is not particularly accurate because it is being used for measurements that do not need a high level of accuracy. In addition, analog circuitry and analog-to-digital conversion circuitry used by the charge control circuitry 105 also lacks precision because again these measurements do not need a high level of accuracy. In contrast, the battery charge sense resistor ($R_{BATTERY}$) 112 has been traditionally used to make precise measurements of the amount of charge going into and leaving the battery cells 108. This precise battery charge measurement is reported through the BMU 109 so that the system 100 can know how much charge is left on the battery 107.

As described herein, the power meter control circuitry 103 uses accurate charge measurements from the battery charge sense resistor ($R_{BATTERY}$) 112 to calibrate relatively imprecise input power measurements made using the input power sensing resistor ($R_{SENSE}$) 114. As such, the power meter control circuitry 103 can then use the auto-calibrated input power measurements to provide relatively accurate power usage information for the portable information handling system 100.

Calibration is performed by obtaining battery charge measurements from the battery management unit (BMU) within the battery during times of relatively known power usage by the system. One such period of time is when the system is powered down and the battery is charging through the AC/DC converter 111. In particular, when the battery is in a charging state correlating to a high charge current region, the battery charge current metering is particularly accurate. As such, although not required, it is advantageous to conduct calibration when the battery is being charged from below a selected charge state that has been selected to be below a particular threshold so that the battery will be charging in this high charge current region. As is known, most batteries will experience a high charge rate when they are charging from a relatively highly discharged state, and this charge rate will slow down as the battery becomes more and more charged. The calibration of the input power measurements, therefore, can be conducted only when the battery is being charged from below a selected charge state, if desired.

When the system 100 is in a powered down state and the battery is charging, the battery is absorbing charge, and this power usage can be precisely measured using the battery charge sense resistor ($R_{BATTERY}$) 112. Other power losses within the system can also be taken into account, such as losses due to circuitry with the charger 101 and/or the AC/DC adapter 111. These power losses from known sources within the system likely can be fairly accurately determined and/or ignored if they are negligible. Next, the input power can be measured using the input power sensing resistor ($R_{SENSE}$) 114 within the charger 101. By comparing the measured input power with the battery charge measurement with or without considering other known losses, the input power measurement can be calibrated. Once the input power measurement has been auto-calibrated, this auto-calibrated input power measurement can be subsequently used to provide an accurate determination of power usage. As such, when the system 100 is powered on and operating on power provided by the AC/DC adapter 111, the power meter control circuitry 103 can take an input power measurement using the input power sensing resistor ($R_{SENSE}$) 114 and then apply the results of the calibration to generate relatively precise auto-calibrated power usage information. This auto-calibrated power usage information can then be reported for the system 100. Determining the power usage information, therefore, is performed by measuring the input power using the input power sensing resistor ($R_{SENSE}$) 114 within the charger 101 as an indicator of system power usage and then adjusting the input power measurement by the calibration results. In addition, as indicated above, an efficiency curve for the AC/DC adapter can be applied to convert DC power measurements to AC power measurements, as the input power sensing resistor ($R_{SENSE}$) 114 within the charger 111 is measuring DC power.

Figure 2:
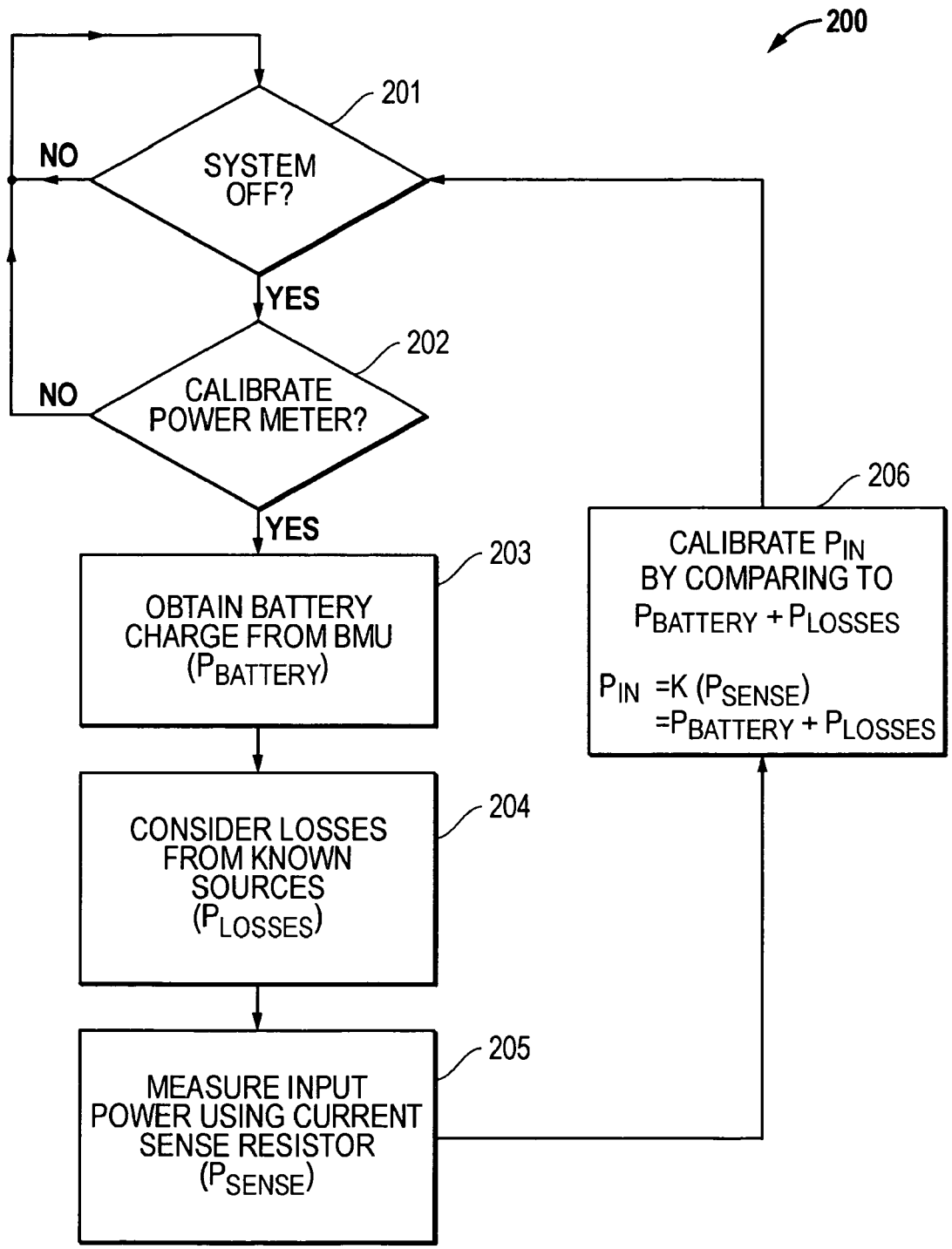
FIG. 2 is a flowchart for calibrating an input power measurement when the portable information handling system is powered down and the battery is charging.

FIG. 2 is a flowchart for a process 200 for calibrating a power measurement when the portable information handling system is powered down. The process 200 begins in 201 where a determination is made regarding whether the portable information handling system is powered down or "off." If the determination is "NO," the process repeats back to the determining step 201. If the determination is "YES" that the system is powered down or "off," then determination block 202 is reached where a determination is made whether or not to conduct a calibration of the power usage meter. If "NO," then flow moves back to determination step 201. As stated above, one example of a condition where it may not be desirable to perform the calibration step when the system is powered down is when the battery is not sufficiently discharged so that the battery will be charging in a high charge current region. Other conditions and parameters may also be applied, as desired, in the determination of whether or not to perform a calibration in determination step 202. If the determination in step 202 is "YES," then the process proceeds to block 203.

In block 203, a battery charge measurement ($P_{BATTERY}$) is obtained from the BMU within the battery. Next, in block 204, power losses ($P_{LOSSES}$) from known sources within the system can be considered, if desired. These known power losses, for example, can include losses within the charger ($P_{CH\_Loss}$) and losses within the AC/DC adapter or converter ($P_{AD-LOSS}$). In block 205, input power ($P_{IN}$) to the system is measured using the input power sensing resistor ($R_{SENSE}$) 114 to obtain a measure of sensed input power ($P_{SENSE}$). Finally, in block 206, the input power ($P_{IN}$) is calibrated by comparing the sensed input power ($P_{SENSE}$) to the battery charge measurement ($P_{BATTERY}$). Known losses ($P_{LOSSES}$) can also be considered. A calibration factor (K) for the input power usage measurement can be determined based upon this comparison. The following general equation can be used: $P_{IN}=K(P_{SENSE})=P_{BATTERY}+P_{LOSSES}$. After the calibration in step 206, the process proceeds back to the determination step 201. It is noted that while a calibration factor (K) is one technique for calibrating the sensed input power measurement ($P_{SENSE}$), other algorithms could also be used for making this calibration while still using battery charge measurements to perform the calibration of input power measurements.

To increase the accuracy of the calibration, the calibration process 200 can be repeated a plurality of times. For example, the calibration process 200 could be repeated a selected number of times in order to make a better determination of the calibration factor (K). Averaging or statistical analysis could be applied, as desired, to these repeated measurements. The calibration factor (K), for example, could be determined from the mean or median values determined over a number of different calibrations in order to determine a more precise calibration factor (K). Still further, the calibration could be implemented each time the portable information handling system 100 is powered down, and the results of each separate calibration cycle could be compared and/or analyzed to determine and/or update the calibration factor (K). It is noted that the calibration need not be conducted each time the system 100 is powered down. And this calibration can be conducted according to a variety of algorithms, conditions or parameters, as desired, while still using battery charge measurements to perform the calibration of input power measurements.

Figure 3:
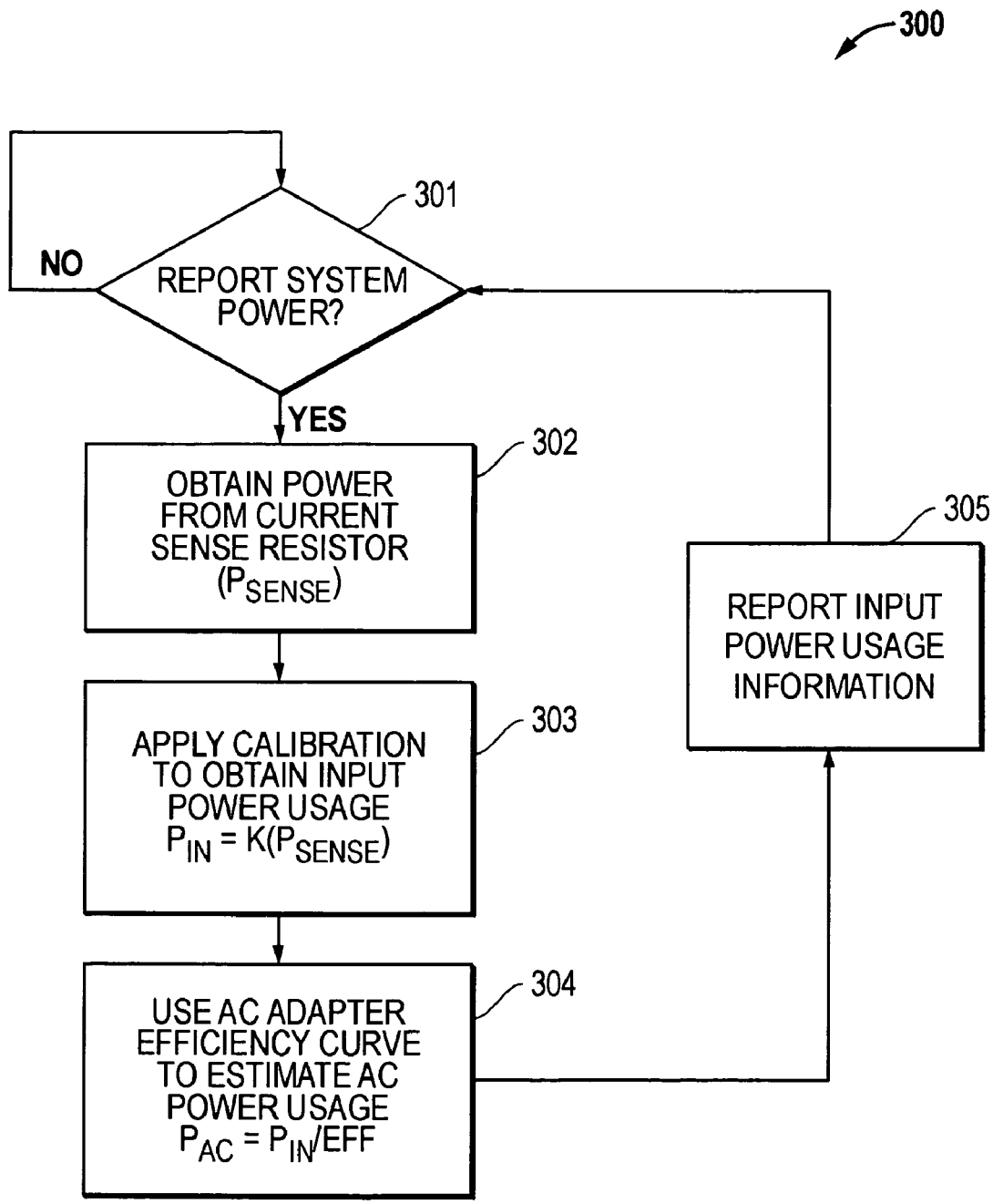
FIG. 3 is a flowchart of reporting a power measurement when the portable information handling system is powered up.

FIG. 3 is a flowchart for a process 300 for determining and reporting power usage information when the portable information handling system is powered up. The process begins in step 301 where a determination is made regarding whether or not to report system power usage. If "NO," then system power usage information is not reported, and the process loops back to step 301. If "YES," then step 302 is reached where a sensed input power measurement ($P_{SENSE}$) is obtained using the current sense resistor ($R_{SENSE}$) 114. Next, in block 303, the results of the calibration process is applied to the sensed input power ($P_{SENSE}$) to obtain a measure of the input power usage, for example, by applying a calibration factor (K) to the sensed input power ($P_{SENSE}$) to generate an indication of input power usage ($P_{IN}$) for the system according to the representation that $P_{IN}=K(P_{SENSE})$. In block 304, an efficiency curve for the AC/DC adapter can be applied to convert the DC measurement associated with the current sense resistor ($R_{SENSE}$) 114 to an AC measurement according to the representation that $P_{AC}=P_{IN}/EFF$, where EFF represents the AC to DC conversion efficiency of the AC/DC adapter. Finally, in step 305 the input power usage information can be reported for the portable information handling system and used, as desired, by the portable information handling system and/or users/owners of the systems.

Further modifications and alternative embodiments of the techniques described herein will be apparent to those skilled in the art in view of this description. It will be recognized, therefore, that the techniques described herein are not limited by these example arrangements. Accordingly, this description is to be construed as illustrative only and is for the purpose of teaching those skilled in the art the manner of carrying out the techniques described herein. It is to be understood that the forms of the techniques described herein shown and described are to be taken as the presently preferred embodiments. Various changes may be made in the implementations and architectures. For example, equivalent elements may be substituted for those illustrated and described herein and certain features of the techniques described herein may be utilized independently of the use of other features, all as would be apparent to one skilled in the art after having the benefit of this description of the techniques.

What is claimed is:
1. A method for operating a portable information handling system to calibrate and determine power usage information, comprising:
providing a portable information handling system including a battery, a charger, and an AC/DC adapter;
powering down the portable information handling system;
charging the battery using the AC/DC adapter;
while powered down calibrating an input power measurement for the portable information handling system by
measuring battery charge with the battery;
measuring input power with the charger; and
comparing the input power measurement to the battery charge measurement to determine a calibration factor for the input power measurement;
powering on the portable information handling system;
operating the portable information handling system using power provided through the AC/DC adapter; and
determining power usage for the portable information handling system by measuring input power with the charger;
adjusting the input power measurement by the calibration factor to generate calibrated power usage information; and
utilizing the calibrated power usage information as an indication of power usage for the portable information handling system.

2. The method of claim 1, further comprising considering power losses from known sources in the calibrating step.

3. The method of claim 2, wherein the considering step comprises considering power losses due to losses caused by circuitry within the charger and losses caused by circuitry with the AC/DC adapter.

4. The method of claim 1, further comprising using a resistor to measure input power with the charger.

5. The method of claim 1, further comprising using a resistor to measure battery charge with the battery.

6. The method of claim 1, further comprising obtaining battery charge information from the battery through a battery management unit within the battery.

7. The method of claim 1, further comprising using an efficiency curve for the AC/DC adapter to convert power usage information from a DC measurement to an AC measurement.

8. The method of claim 1, further comprising performing the calibration step a plurality of times to improve accuracy of the calibration factor.

9. The method of claim 1, further comprising performing the calibration step every time the portable information handling step is powered down and the battery is being charged.

10. The method of claim 1, further comprising performing the calibration step only if the battery is being charged from below a selected charge state.

* * * * *